United States Patent
Damlencourt et al.

(10) Patent No.: US 9,040,391 B2
(45) Date of Patent: May 26, 2015

(54) PROCESS FOR PRODUCING LOCALISED GEOI STRUCTURES, OBTAINED BY GERMANIUM CONDENSATION

(75) Inventors: Jean-François Damlencourt, Laval (FR); Benjamin Vincent, Ixelles (BE)

(73) Assignee: COMMISSARIAT A L'ENERGIE ATOMIQUE, Paris (FR)

( * ) Notice: Subject to any disclaimer, the term of this patent is extended or adjusted under 35 U.S.C. 154(b) by 1274 days.

(21) Appl. No.: 12/539,713

(22) Filed: Aug. 12, 2009

(65) Prior Publication Data
US 2010/0044836 A1 Feb. 25, 2010

(30) Foreign Application Priority Data
Aug. 22, 2008 (FR) ..................... 08 55671

(51) Int. Cl.
| | |
|---|---|
| H01L 21/20 | (2006.01) |
| H01L 21/316 | (2006.01) |
| H01L 21/02 | (2006.01) |
| H01L 21/28 | (2006.01) |
| H01L 21/762 | (2006.01) |
| H01L 29/10 | (2006.01) |
| H01L 29/78 | (2006.01) |

(52) U.S. Cl.
CPC .... *H01L 21/31658* (2013.01); *H01L 21/02203* (2013.01); *H01L 21/02236* (2013.01); *H01L 21/02255* (2013.01); *H01L 21/28255* (2013.01); *H01L 21/7624* (2013.01); *H01L 29/1054* (2013.01); *H01L 29/78* (2013.01)

(58) Field of Classification Search
USPC ............... 438/478, 479; 257/616, E29.084, 257/E21.561
See application file for complete search history.

(56) References Cited

U.S. PATENT DOCUMENTS

| | | | |
|---|---|---|---|
| 2002/0130393 A1* | 9/2002 | Takayanagi et al. | 257/616 |
| 2005/0056352 A1* | 3/2005 | Bedell et al. | 148/537 |
| 2005/0221591 A1 | 10/2005 | Bedell | |
| 2006/0042542 A1 | 3/2006 | Bedell | |
| 2007/0207598 A1* | 9/2007 | Damlencourt et al. | 438/479 |
| 2007/0284625 A1 | 12/2007 | Damlencourt | |

FOREIGN PATENT DOCUMENTS

| | | |
|---|---|---|
| EP | 1 801 854 A | 6/2007 |
| FR | 2 902 234 A1 | 12/2007 |

OTHER PUBLICATIONS

Yin H et al; "High-Germanium-Content SiGe Islands Formed on Compliant Oxide by SiGe Oxidation"; Applied Physics Letters, AIP, American Institute of Physics, Melville NY, May 3, 2004, pp. 3624-3626.

Nassau K et al; "Modified Phosphosilicate Glasses for VLSI Applications"; Journal of the Electrochemical Society, vol. 132, No. 2, Feb. 1985, pp. 409-415.

(Continued)

*Primary Examiner* — Samuel Gebremariam
(74) *Attorney, Agent, or Firm* — Pearne & Gordon LLP

(57) ABSTRACT

The invention relates to a process for making at least one GeOI structure by germanium condensation of a SiGe layer supported by a layer of silicon oxide. The layer of silicon oxide is doped with germanium, the concentration of germanium in the layer of silicon oxide being such that it lowers the flow temperature of the layer of silicon oxide below the oxidation temperature allowing germanium condensation of the SiGe layer.

5 Claims, 3 Drawing Sheets

(56) References Cited

OTHER PUBLICATIONS

Figure 1:
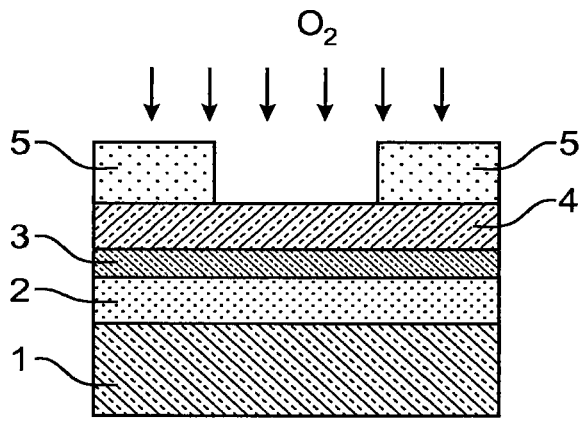

Sadoh T et al; "Improvement of Oxidation-Induced Ge Condensation Method by H+ Implantation and Two-Step Annealing for Highly Stress-Relaxed SiGe-on-Insulator"; Japanese Journal of Applied Physics, vol. 44, No. 48, Apr. 21, 2005, pp. 2357-2360.

French Search Report, Mar. 26, 2009.

C. Fenouillet-Beranger et al., "Requirements for ultra-thing-film devices and new materials for the CMOS roadmap", Solid-State Electronics, vol. 48, 2004.

Tsutomu Tezuka et al., "A Novel Fabrication Technique of Ultrathin and Relaxed SiGe Buffer Layers with High Ge Fraction for Sub-100nm Strained Silicon-on-Insulator MOSFETs", Jpn. J. Appl. Phys., vol. 40, 2001.

Y.H.Lo, "New approach to grow pseudomorphic structure over the critical thickness" Appl. Phys. Lett., vol. 59, No. 18, Oct. 28, 1991.

R.L. Smith, S.D. Collins, "Porous silicon formation mechanisms" J. Appl. Phys., vol. 71, No. 8, Apr. 15, 1992.

\* cited by examiner

PROCESS FOR PRODUCING LOCALISED GEOI STRUCTURES, OBTAINED BY GERMANIUM CONDENSATION

TECHNICAL FIELD

The invention relates to a process for manufacturing localised GeOI structures, obtained by germanium condensation.

PRIOR ART

The race to performance (level of current, speed, . . . ) in silicon microelectronics is continually striving to miniaturise the size of transistors (Moore's law). In parallel with this miniaturisation method, introduction approaches to novel materials (for example materials with strong mobility such as germanium) and mechanical constraints (a tension constraint favours electronic transport whereas a compression constraint favours transport via holes) are under study.

The base elements of C-MOS microelectronics ("Complementary Metal Oxide Semiconductor") are N-MOS (electron conduction transistor) and P-MOS (hole conduction transistor). These two types of transistors are combined to produce logic functions (OR, AND, NOR, NAND gates, . . . ) or memory points (SRAM-6T for example). Today, all components for consumer microelectronics are made on silicon substrates.

Due to the ratio of volumic mobilities between electrons and holes in the silicon (respectively 1500 and 500 $cm^2/V/s$), the electric characteristics of the N-MOS and P-MOS transistors exhibit dissymetries and the P-MOS are much less effective (in terms of current output and thus speed) than the N-MOS.

The co-integration of N-MOS silicon and P-MOS germanium on the same substrate is means for improving the characteristics of the P-MOS in the C-MOS circuit but also for balancing the transistors N and P as much in terms of current level as in terms of time constants, this without loss of place. In fact, the volumic mobility of the holes in the germanium is of the order of 1900 $cm^2/V/s$ and that of the electrons in the silicon is close to 1500 $cm^2/V/s$, allowing N and P transistors of the same dimensions and having almost the same electric characteristics to be manufactured.

Still in a perspective for improving performance, germanium could conceivably be used for N-MOS since the volumic mobility of the electrons in germanium is close to 4000 $cm^2/V/s$ (against 1500 $cm^2/V/s$ on silicon). But today a misunderstood physical phenomenon limits the performances of N-MOS on germanium. Currently, the electric characteristics of germanium N-MOS are not as good as those of silicon N-MOS, resulting in low current interest in N-MOS on germanium (considering its non-maturity) and the strong interest in Si/Ge co-integration.

Because of the strong electric leaks inherent to the components based on germanium (slight gap), this material can be logically used only "posed" on an insulator. The germanium-on-insulator (or GeOI) substrates thus limit the leaks via the substrate and largely improve the characteristics of the resulting components.

Localised zones of germanium on insulator can be produced via said technique of germanium condensation. This subject can be referred to in the article "A Novel Fabrication Technique of Ultrathin and Relaxed SiGe Buffer Layers with High Ge Fraction for Sub-100 nm Strained Silicon-on-Insulator MOSFETS" by T. TEZUKA et al., Jpn. J. Appl. Phys., vol. 40 (2001) 2866-2874.

The first step of this technique consists of epitaxy of an SiGe layer on a Silicon-on-Insulator substrate (SOI). The concentration and the thickness of the epitaxied SiGe layer are preferably selected so that the SiGe layer is in a state of pseudomorphic constraint. The second step is dry oxidation at high temperature (above 900° C.) allowing exclusive formation of oxide $SiO_2$ due to formation enthalpy (negative) greater than that of $GeO_2$. During oxidation, germanium is trapped in between two barriers: the interface with the buried oxide (BOX), is fixed, and the oxidation interface is in movement. Due to the high oxidation temperature, germanium diffuses in the SiGe layer delimited by these two barriers, thus homogenising the SiGe alloy. With the thickness of the SiGe decreasing, the concentration of germanium is enriched during oxidation, thus forming a substrate of silicon-germanium on insulator (SGOI). The concentration of Ge can reach 100% via this technique to form a pure GeOI substrate with an adapted oxidation time.

A first embodiment consists of non-selective depositing of SiGe on a substrate of silicon on insulator and masking, by means of a layer impermeable to oxidation, of zones which are not to be enriched. Enrichment is thus done on the non-masked zones. The masked zones are made of silicon nitride. A non-masked zone (for example a "channel" transistor zone) is enriched with Ge during oxidation, while masked zones (for example "source and drain" transistor zones) are made of low-concentration SiGe (diffusion of Ge from the SiGe layer to the Si layer to balance the concentrations). This first embodiment is described in document FR-A-2 902 234 corresponding to document US 2007/284625. FIG. 1 is a view in transversal section illustrating this embodiment. The substrate comprises a silicon support 1 successively supporting a buried oxide layer 2, a thin silicon layer 3 and a SiGe layer 4. Reference numeral 5 represents a mask of $Si_3N_4$. Localised enrichment is done in the non-masked zones (one only is shown). The result in the non-masked zones is a SiGe layer enriched with germanium, or even a layer of germanium, resting on the buried oxide layer and surmounted by a layer of silicon oxide.

Figure 2:
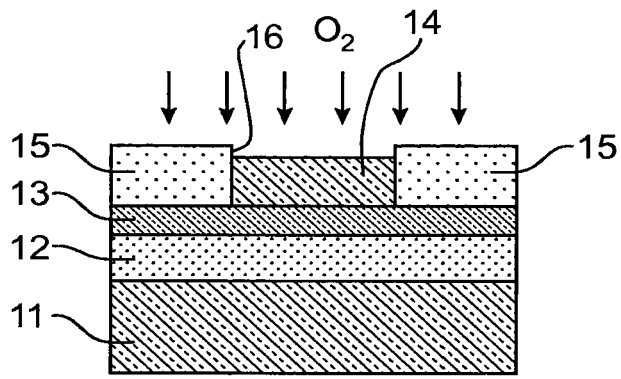

A second embodiment consists of depositing selective SiGe in cavities made in a layer of material impermeable to oxidation and defined on a SOI substrate. The "channel" zone is enriched with germanium during oxidation, whereas the "source and drain" zones remain in silicon. FIG. 2 is a view in transversal section illustrating this embodiment. The substrate comprises a silicon support 11 successively supporting a buried oxide layer 12, a thin silicon layer 13 and a layer of silicon nitride 15. Cavities 16 (one only is shown) are made in the layer of nitride 15 until the thin silicon layer 13 is revealed. Depositing SiGe 14 is done in the cavities 16. Germanium condensation is thus completed. The result is a SiGe layer enriched with germanium, or even a layer of germanium, resting on the buried oxide layer and surmounted by a layer of silicon oxide.

Figure 3:
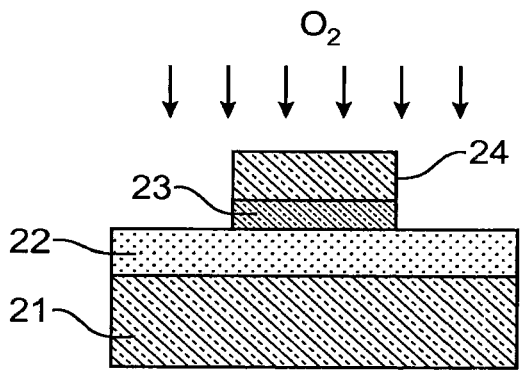

A third embodiment consists of defining mesa zones from a SiGe layer deposited non-selectively on a SOI substrate. The SiGe zones are then enriched. The "channel" and "source and drain" zones are in this case enriched by germanium, or even are made of germanium. FIG. 3 is a transversal sectional view illustrating this embodiment. The substrate comprises a silicon support 21 successively supporting a buried oxide layer 22, a thin silicon layer 23 and a SiGe layer 24. Mesa zones are defined from the thin silicon layer 23 and the SiGe layer 24. Germanium condensation is thus completed. The result is a SiGe layer enriched with germanium, or even a layer of germanium, resting on the oxide layer and surmounted by a layer of silicon oxide.

These embodiments are likely to have disadvantages. For the first and second embodiments, birds' beaks are evident, that is, a variation in the concentration and thickness of the SiGe. For the third embodiment, oxidation of the buried oxide layer, of LOCOS type, with oxidation and lateral enrichment is evident.

These lateral enrichment phenomena observed during enrichment of the mesas are problematic because they result in enrichment unevenness on the substrate as a function of the size of the patterns. Raman examination of patterns of different sizes enriched with germanium, done on a 200 mm substrate, after an oxidation/condensation step, reveals that the smallest pattern is enriched with germanium at 100%, whereas the largest pattern is enriched at only 73% at the centre and has substantial unevenness. This unevenness evident on different patterns extends over a few micrometers and cannot be due only to a single lateral enrichment phenomenon. In fact, the diffusion lengths of the Ge atoms are of the order of a few hundreds of nanometers, while these phenomena extend over a few micrometers.

Figure 4A:
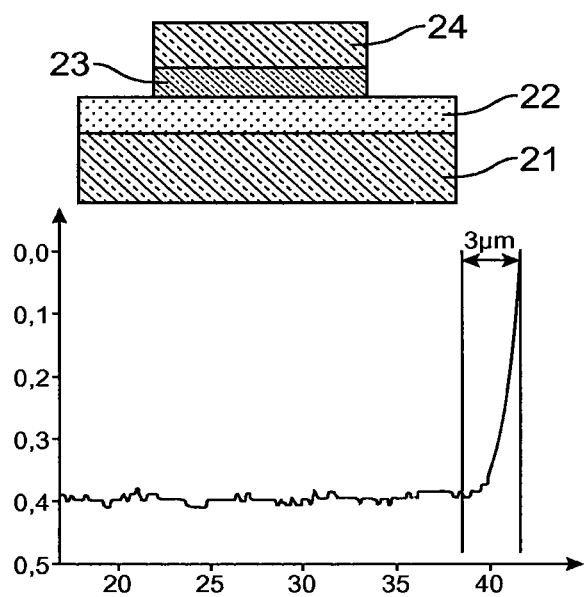
Figure 4B:
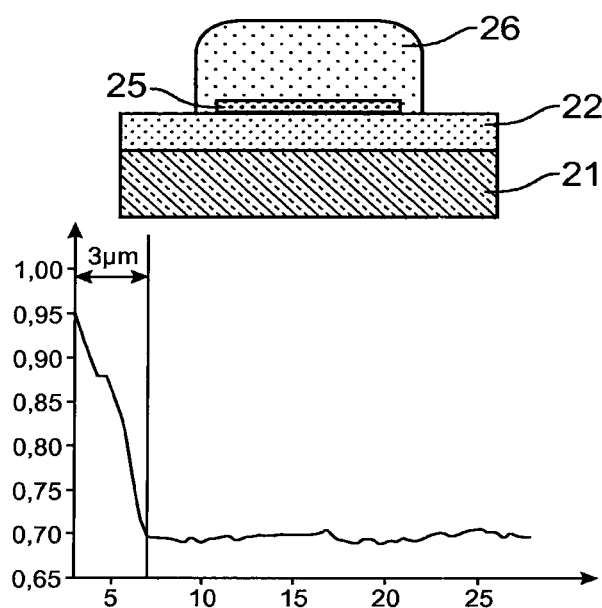

FIG. 4A, which summarises the third embodiment, presents a Raman spectrum of a mesa structure after etching and prior to condensation where a gradient of constraint at the edges of the mesa is distinguished very clearly. This phenomenon is known and is associated to elastic relaxation along the pattern edge. This relaxation extends over a distance of around 3 μm. After condensation (see FIG. 4B), unevenness in concentration of this same mesa is noticed over a distance equivalent to that prior to condensation. In FIG. 4B, reference numeral 25 represents the layer of germanium obtained, surmounted by a layer of silicon oxide 26. The conclusion from this is that the elastic relaxation along the edge locally modifies the oxidation kinetic and accordingly final condensation. This phenomenon is problematic since its impact is different according to the size of the patterns and will cause differences in final concentration on a 200 mm plate configured according to the present patterns.

It is also known to elastically relax the constraints in a layer of silicon oxide doped with phosphorous and boron (BPSG). This relaxation phenomenon of constraints has already been studied and produced compliant substrates. This subject can be referred to in the article "New Approach to Grow Pseudomorphic Structures over the Critical Thickness" by Y. H. LO, Appl. Phys. Lett. 59 (18), pages 2311 to 2313, Oct. 28, 1991.

The article "Modified Phosphosilicate Glasses for VLSI Applications" by K. NASSAU et al., J. Electrochem. Soc.: Solid-State Science and Technology, Vol. 132, No. 2, 1985, pages 409 to 415, describes the influence of dopants on the flow temperature of certain oxides. Table 1 of this document reproduced hereinbelow shows the influence on the flow temperature (corresponding to a viscosity of $10^{13}$ poises) of silicon oxide doping by phosphorous, boron and germanium relative to the non-doped silicon oxide. In this table, the symbol m/o represents the molar percentage of the compound relative to the composition of the doped $SiO_2$.

| m/o $P_2O_3$ | m/o $B_2O_3$ | m/o $GeO_2$ | m/o $SiO_2$ | $T_g$ (°C.) |
|---|---|---|---|---|
|   |   |   | 100.0 | 1160 |
| 8 |   |   | 92.0 | 725 |
|   | 5.0 |   | 95.0 | 815 |
|   | 9.3 |   | 90.7 | 700 |
|   | 11.0 |   | 89.0 | 685 |
|   | 15.7 |   | 84.3 | 540 |
|   | 17.0 |   | 83.0 | 535 |
|   |   | 4.1 | 95.9 | 800 |
|   |   | 7.0 | 93.0 | 750 |
|   |   | 13.3 | 86.7 | 730 |
|   |   | 13.5 | 86.5 | 725 |
|   |   | 31.0 | 69.0 | 650 |
|   |   | 45.0 | 55.0 | 660 |

As is evident from this table, if standard silicon oxide is doped, it is possible to lower its flow temperature Tg. The flow temperature of the non-doped silicon oxide is 1160° C. If it is doped with $4,4.10^{20}$ atoms/cm³ of boron (corresponding to 5 m/o $B_2O_3$), the flow temperature is lowered to 815° C. By doping silicon oxide with atoms of germanium of 4,1 to 7 m/o $GeO_2$, the flow temperature can be lowered from 1160° C. to respectively 800° C. and 750° C.

SUMMARY OF THE INVENTION

The present invention proposes to overcome the problems revealed hereinabove by relaxing the constraints elastically (without creating defects) by using a oxide fluent at low temperature.

It is thus proposed to conduct localised germanium condensation on oxide fluent at low temperature. Using such oxide, in place of standard $SiO_2$ oxide, prevents the storage of constraints during condensation and thus avoids creating structural defects.

During condensation, boron can diffuse in the enriched oxide layer and consequently become a pollutant, as does phosphorous. It is proposed to produce localised GeOI on a layer of $SiO_2$ doped with Ge, which could be called compliant SOI, and which relaxes the constraints during progressive enrichment and thus produces GeOI without structural defects. Also, relaxing these constraints limits any evident oxidation unevenness. According to the invention, a deposit is made of porous SiGe with a Ge concentration of the order of 1 to 45% of germanium and advantageously of the order of 4 to 13 m/o Ge. Porous SiGe can be obtained by electrochemical attack of a monocrystalline SiGe layer doped with boron or phosphorous in a solution based on hydrofluoric acid.

The aim of the invention is a process for making at least one GeOI structure by germanium condensation of a SiGe layer supported by a layer of silicon oxide, characterised in that the layer of silicon oxide is doped with germanium, the concentration of germanium in the layer of silicon oxide being such that it lowers the flow temperature of the layer of silicon oxide below the oxidation temperature, allowing germanium condensation of the SiGe layer.

Preferably, the concentration of germanium in the layer of silicon oxide is such that the molar percentage of $GeO_2$ relative to the composition of the doped layer of silicon oxide is between 4 and 13 m/o.

Advantageously, the layer of silicon oxide doped with germanium is obtained by oxidation of a porous SiGe layer.

The process can comprise the following steps:
formation of the initial layer of monocrystalline SiGe doped on a support substrate,
formation of pores in the initial layer of doped SiGe,
formation of a first continuous monocrystalline silicon layer on the porous SiGe layer,
formation of a monocrystalline SiGe layer intended to be enriched with germanium on the silicon layer,
formation of a second monocrystalline silicon layer on the SiGe layer intended to be enriched with germanium, definition of at least one mesa in the stack constituted by the first silicon layer, the SiGe layer intended to be enriched with germanium and the second silicon layer, depositing protective spacers on the flanks of the mesa, oxidation of the porous SiGe layer to create the layer of silicon oxide doped with germanium, germanium condensation of the SiGe layer intended to be enriched with germanium.

Another aim of the invention is a semiconductor structure comprising:

a substrate, a layer of silicon oxide formed on the substrate, a SiGe zone formed above the layer of silicon oxide, characterised in that the layer of silicon oxide is a layer doped with germanium, the concentration of germanium in the layer of silicon oxide being such that it lowers the flow temperature of the layer of silicon oxide below the oxidation temperature allowing germanium condensation of the SiGe zone.

Such a structure makes use of the process according to the invention.

According to a preferred embodiment, the SiGe zone forms part of a mesa comprising a first silicon layer interleaved between the layer of silicon oxide doped with germanium and the SiGe zone, the mesa likewise comprising a second silicon layer on the SiGe zone.

The flanks of the mesa can be covered by protective spacers, for example made of silicon nitride.

BRIEF DESCRIPTION OF THE DIAGRAMS

The invention will be better understood and other advantages and particular features will emerge from the following description, given by way of non-limiting example, accompanied by the attached diagrams, in which:

FIG. 1, already described, illustrates a first embodiment of the localised germanium condensation technique, FIG. 2, already described, illustrates a second embodiment of the localised germanium condensation technique, FIG. 3, already described, illustrates a third embodiment of the localised germanium condensation technique, FIGS. 4A and 4B, already described, present Raman spectra of a mesa structure after etching, respectively prior to condensation and after condensation, FIGS. 5A to 5F are views in transversal section illustrating the production process of localised GeOI structures, obtained by germanium condensation.

DETAILED EXPLANATION OF A PARTICULAR EMBODIMENT

A particular embodiment of the invention will now be described. This embodiment is illustrated by FIGS. 5A to 5F which are views in transversal section.

Figure 5A:
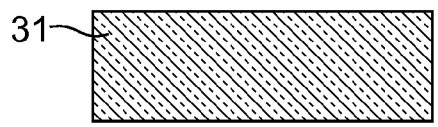

FIG. 5A represents a substrate 31 made of silicon acting as support to carry out the process according to the present invention.

Figure 5B:
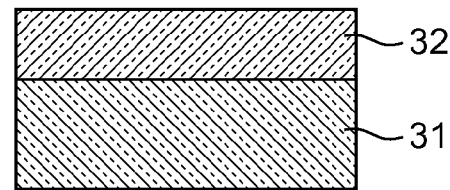

A layer 32 of monocrystalline $Si_xGe_{1-x}$ doped with boron or phosphorous having a concentration of germanium is formed on the substrate 31 by epitaxy, according to a method known to the man skilled in the art, resulting in a concentration of germanium corresponding from 4 to 7 m/o $GeO_2$ in the silicon oxide which will then be formed (see FIG. 5B).

The layer 32 of SiGe is made porous by electrochemical attack in a solution of hydrofluoric acid. Sending a continuous current over a certain time period (from a few seconds to a few tens of minutes according to the preferred thickness of the porous layer, the doping rate of the SiGe layer and the nature of the dopant used) causes attack of the SiGe doped in depth and formation under the free surface of the layer 32 of a homogeneous layer of porous material whereof the porosity (volumic percentage of holes) can reach 90%. The porosity and thickness of porous SiGe formed increases as a function of the current density, though also depends on doping of the SiGe layer, HF concentration and other parameters. This can produce layers of porous SiGe of different thicknesses (from 1 nm to a few hundreds of nm) and, after oxidation, can produce buried oxides of different thicknesses (fine BOX to thick BOX). By way of advantage, a porous SiGe layer of 145 nm can be selected, vis-à-vis the thickness barrier to leak compromise.

With respect to the influence of the type of doping, the rate of doping and the electric current used on the morphology and size of the pores obtained in the monocrystalline silicon, reference can be made to the article "Porous silicon formation mechanisms" by R. L. SMITH et al., J. Appl. Phys. 71(8), R1-R22, Apr. 15, 1992.

In the article "Requirements for ultra-thin-film devices and new materials for the CMOS roadmap", Solid-State Electronics 48 (2004), pages 961 to 967 C. FENOUILLET-BE-RANGER et al. describe the influence of the thickness of an buried oxide layer on short channel effects. This is what is known as "short channel effects", which is any parameter degrading electrostatic control of the gate, engendering a drop in performance of a transistor, for example the threshold voltage ($V_{th}$), off current ($I_{off}$), etc.

Figure 5C:
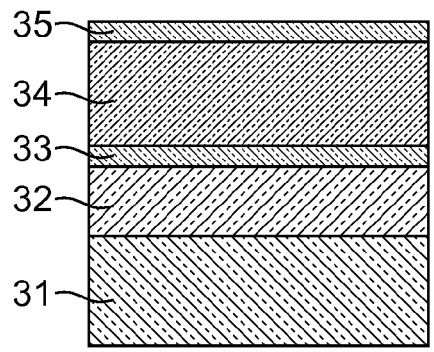

A monocrystalline silicon layer 33 of several nm in thickness is deposited onto the layer 32 of porous SiGe by epitaxy, according to a method known to the man skilled in the art, (see FIG. 5C). This layer will also act as mask during oxidation of the porous SiGe layer 32. The monocrystalline silicon layer 33 is deposited continuously onto the porous SiGe layer 32 and promotes growth of a layer of monocrystalline $Si_xGe_{1-x}$ 34 necessary for germanium condensation (see FIG. 5C).

A fine layer 35 of silicon of a few nm in thickness, ideally 2 nm is formed on the layer of $Si_xGe_{1-x}$ 34 by epitaxy (see FIG. 5C).

Figure 5D:
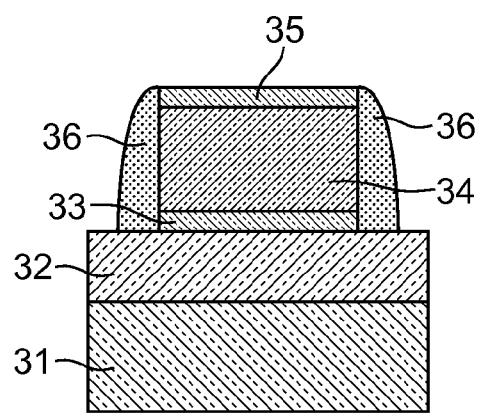
Figure 5E:
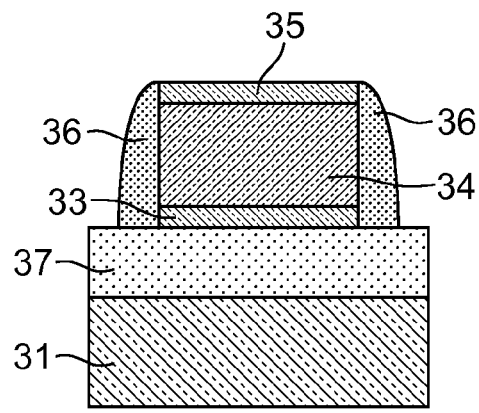
Figure 5F:
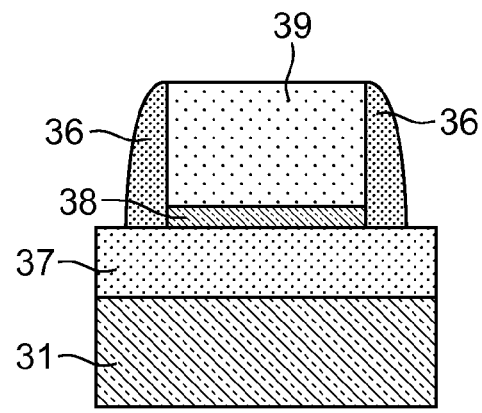

The zones which will be localised germanium zones are defined by a lithoetching process. For the sake of simplicity, FIG. 5D shows a single one of these zones. The stack of layers 33 of silicon, 34 of $Si_xGe_{1-x}$ and 35 of silicon is etched using plasma etching, stopping on the porous SiGe layer 32. Spacers 36 made of dielectric material are then deposited on the flanks of the etched structure. These spacers are made of silicon nitride for example. Their purpose is to protect the flanks of the structure.

The porous SiGe layer 32 revealed in this way will be the starting path of the oxidation of this layer 32 to create a layer of $SiO_2$ doped with Ge. The oxidation temperature can be between 400° C. and 700° C., and ideally 600° C. Due to the differences in oxidation speed of the porous SiGe and the monocrystalline silicon layer 33, the silicon layer 33 acts as a layer stopping oxidation. The result is a layer 37 of $SiO_2$ doped with Ge (see FIG. 5E).

Germanium condensation can be carried out by using the process known to the man skilled in the art: dry oxidation at a temperature above 900° C. This temperature is greater than the flow temperature of the layer 37 of $SiO_2$ doped with Ge. The result on the layer 37 is thus a layer 38 of SiGe enriched with germanium, or even a layer of germanium. The layer 38 is then surmounted by a layer 39 of silicon oxide.

The invention claimed is:

1. A process for making at least one germanium-on-insulator structure, comprising the steps of:

forming a porous silicon germanium layer (32) on a substrate (31);

forming a first silicon layer (33) on the porous silicon germanium layer (32);

forming a layer of silicon germanium (34) intended to be enriched with germanium on the silicon layer (33);

oxidizing the porous silicon germanium layer (32), thereby forming a layer of silicon oxide (37) doped with germanium;

performing germanium condensation of the layer of silicon germanium (34) intended to be enriched with germanium, resulting in a layer (38) of silicon germanium enriched with germanium or with a layer of germanium on the layer of silicon oxide (37) doped with germanium.

2. The process as claimed in claim 1, in which the concentration of germanium in the layer of silicon oxide (37) doped with germanium is such that the molar percentage of germanium dioxide relative to the composition of the layer of silicon oxide doped with germanium is between 4 and 13 m/o.

3. The process as claimed in claim 1 or 2, in which the porous silicon germanium layer is obtained by electrochemical attack of an initial layer of doped silicon germanium a solution of hydrofluoric acid.

4. The process as claimed in claim 1, further comprising, before oxidizing the porous silicon germanium layer (32), the following steps:

formation of a second silicon layer (35) on the silicon germanium layer (34) intended to be enriched with germanium, definition of at least one mesa in the stack constituted by the first silicon layer (33), the silicon germanium layer (34) intended to be enriched with germanium and the second silicon layer (35), depositing protective spacers (36) on the flanks of the mesa.

5. The process as claimed in claim 4, in which the protective spacers (36) are made of silicon nitride.

* * * * *